United States Patent
Lien et al.

(10) Patent No.: US 9,645,459 B2
(45) Date of Patent: May 9, 2017

(54) TFT SUBSTRATE AND METHOD FOR MANUFACTURING THE SAME

(71) Applicant: Shenzhen China Star Optoelectronics Technology Co., Ltd., Shenzhen, Guangdong (CN)

(72) Inventors: Shui-chih Lien, Guangdong (CN); Yuan Xiong, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 48 days.

(21) Appl. No.: 14/433,628

(22) PCT Filed: Nov. 10, 2014

(86) PCT No.: PCT/CN2014/090673
§ 371 (c)(1),
(2) Date: Apr. 3, 2015

(87) PCT Pub. No.: WO2016/065666
PCT Pub. Date: May 6, 2016

(65) Prior Publication Data
US 2016/0274427 A1  Sep. 22, 2016

(30) Foreign Application Priority Data

Oct. 31, 2014  (CN) .......................... 2014 1 0608304

(51) Int. Cl.
*G02F 1/1362* (2006.01)
*H01L 29/786* (2006.01)
(Continued)

(52) U.S. Cl.
CPC ...... *G02F 1/136209* (2013.01); *G02F 1/1362* (2013.01); *G02F 1/1368* (2013.01);
(Continued)

(58) Field of Classification Search
CPC .................................................. G02F 1/136209
(Continued)

(56) References Cited

U.S. PATENT DOCUMENTS 5,933,208 A * 8/1999 Kim .................. G02F 1/133516
349/104
8,107,038 B2 * 1/2012 Kim .................. G02F 1/136209
345/88

(Continued)

FOREIGN PATENT DOCUMENTS

CN  1624548 A  6/2005
CN  1637555 A  7/2005

*Primary Examiner* — Ori Nadav
(74) *Attorney, Agent, or Firm* — Andrew C. Cheng

(57) ABSTRACT

The present invention provides a TFT substrate and method for manufacturing the same. The method comprises the steps of: providing a substrate; forming a TFT structure above the substrate; further forming a color resist layer above the substrate, and forming a first opening area in the color resist layer at a location corresponding to the TFT structure; forming a first black matrix in the first opening area such that the TFT structure is covered by the first black matrix; and forming a pixel electrode above the color resist layer and the first black matrix, and the pixel electrode being electrically coupled to the TFT structure through the first black matrix. By applying the method described above, the present invention is sufficient to shield the light and reduce the light transmittance effect when the panel comprising the TFT substrate is bent, such that the contrast of the panel can be improved.

2 Claims, 6 Drawing Sheets

(51) Int. Cl.
  *H01L 27/12* (2006.01)
  *G02F 1/1333* (2006.01)
  *G02F 1/1343* (2006.01)
  *G02F 1/1368* (2006.01)

(52) U.S. Cl.
  CPC .... *G02F 1/13439* (2013.01); *G02F 1/133345* (2013.01); *G02F 1/134309* (2013.01); *G02F 1/136213* (2013.01); *G02F 1/136227* (2013.01); *G02F 1/136286* (2013.01); *H01L 27/12* (2013.01); *H01L 27/1218* (2013.01); *H01L 27/1255* (2013.01); *H01L 27/1288* (2013.01); *H01L 29/786* (2013.01); *H01L 29/78669* (2013.01); *G02F 2001/136222* (2013.01); *G02F 2001/136295* (2013.01); *G02F 2201/56* (2013.01)

(58) Field of Classification Search
  USPC ............ 257/66, 72, 79, 347; 438/22, 48, 70, 438/128, 149, 151, 479, 66, 72, 79, 347
  See application file for complete search history.

(56) References Cited

U.S. PATENT DOCUMENTS

| | | | |
|---|---|---|---|
| 2008/0287029 A1* | 11/2008 | Chang | G02F 1/134336 445/24 |
| 2010/0003776 A1* | 1/2010 | Park | G02F 1/13458 438/30 |
| 2010/0038648 A1* | 2/2010 | Cho | G02F 1/136227 257/72 |
| 2010/0059752 A1* | 3/2010 | Lee | G02F 1/136209 257/59 |
| 2016/0209717 A1* | 7/2016 | Lee | G02B 5/201 |

* cited by examiner

TFT SUBSTRATE AND METHOD FOR MANUFACTURING THE SAME

FIELD OF THE INVENTION

The present invention relates to a technique field of display, and more particularly to a TFT substrate and method for manufacturing the same.

BACKGROUND OF THE INVENTION

Because a curved TV provides better contrast, wider viewing angle and flow experience, more in-depth viewing experience could be provided to the users such that it is favored by more and more peoples.

In application of the curved TV, because the panel must be bent for a certain degree, a dislocation between the TFT (Thin Film Transistor) substrate and CF (Color Filter) substrate composing the panel occurs such that the light-shielding effect of the black matrix (BM) disposed on the CF substrate is affected. Please refer to FIG. 1 and FIG. 2 for concrete illustration, FIG. 1 is a light-shielding situation of the black matrix 101 when the panel 100 is not bent, and FIG. 2 is the light-shield situation of the black matrix 101 after bending the panel 100. It can be noted from the FIG. 1 and FIG. 2 that, after bending the panel 100, a part of light is emitted from the side around the black matrix, light leakage occurs and the light-shielding effect of the black matrix 101 is affected, such that the contrast of the panel is reduced.

SUMMARY OF THE INVENTION

A primary technique problem solved by the present invention is to provide a TFT substrate and method for manufacturing the same, which is sufficient to shield the light and reduce the light transmittance effect when the panel comprising the TFT substrate is bent, such that the contrast of the panel can be improved.

In order to solve the technique problem above, one technique solution adopted by the present invention is to provide a method for manufacturing substrate, wherein the method comprises the steps of: providing a substrate; forming a TFT structure above the substrate; further forming a color resist layer above the substrate, and forming a first opening area in the color resist layer at a location corresponding to the TFT structure; forming a first black matrix in the first opening area such that the TFT structure is covered by the first black matrix; and forming a pixel electrode above the color resist layer and the first black matrix, and the pixel electrode being electrically coupled to the TFT structure through the first black matrix;

wherein the step of forming the TFT structure above the substrate further comprises: forming an electrode capacitor above the substrate, wherein a second opening area in the color resist layer is formed at a location corresponding to the capacitor capacitance; wherein the step of forming the first black matrix in the first opening area further comprises: forming a second black matrix in the second opening area such that the electrode capacitor is covered by the second black matrix;

wherein the color resist layer comprises a red, a green and a blue material, and the black matrix is composed of black resin material.

Wherein, the electrode capacitor comprises a first capacitor electrode and a second capacitor electrode, and the step of forming the TFT structure above the substrate comprises: forming a gate electrode, and forming a scan line and the first capacitor electrode disposed at a layer the same as the gate electrode; sequentially forming a first insulating layer and an active layer above the gate electrode, the scan line and the first capacitor electrode being further covered by the first insulating layer, and being not covered by the active layer; forming a source electrode and a drain electrode above the active layer, and forming the second capacitor electrode, which is disposed at a layer the same as the source electrode and the drain electrode, above the first capacitor electrode; and forming a second insulating layer above the source electrode, the drain electrode and the second capacitor electrode, wherein the color resist layer, the first black matrix and the second black matrix are formed above the second insulating layer, and the pixel electrode is electrically coupled to one of the source electrode and the drain electrode through the first black matrix and the second insulating layer, and is further electrically coupled to the second capacitor electrode through the second black matrix and the second insulating layer.

Wherein, the method further comprises: forming an insulating protection layer between the pixel electrode and the first black matrix, the second black matrix and the color resist layer.

Wherein, the step of forming the first black matrix in the first opening area comprises: forming a first contact hole in the first black matrix and the second insulating layer at a location corresponding to one of the source electrode and the drain electrode, and forming a second contact hole in the second black matrix and the second insulating layer at a location corresponding to the second capacitor electrode; and the step of forming the insulating protection layer between the pixel electrode and the first black matrix, the second black matrix and the color resist layer comprises: forming the insulating protection layer in the first contact hole and the second contact hole; and forming a third contact hole and a fourth contact hole in the insulating protection layer in the first contact hole and the second contact hole, respectively, wherein the pixel electrode is electrically coupled to one of the source electrode and the drain electrode through the third contact hole, and is electrically coupled to the second capacitor electrode through the fourth contact hole.

In order to solve the technique problem above, another technique solution adopted by the present invention is to provide a method for manufacturing substrate, wherein the method comprises the steps of: providing a substrate; forming a TFT structure above the substrate; further forming a color resist layer above the substrate, and forming a first opening area in the color resist layer at a location corresponding to the TFT structure; forming a first black matrix in the first opening area such that the TFT structure is covered by the first black matrix; and forming a pixel electrode above the color resist layer and the first black matrix, and the pixel electrode being electrically coupled to the TFT structure through the first black matrix.

Wherein, the step of forming the TFT structure above the substrate further comprises: forming an electrode capacitor above the substrate, wherein a second opening area in the color resist layer is formed at a location corresponding to the capacitor capacitance; and the step of forming the first black matrix in the first opening area further comprises: forming a second black matrix in the second opening area such that the electrode capacitor is covered by the second black matrix.

Wherein, the electrode capacitor comprises a first capacitor electrode and a second capacitor electrode, and the step of forming the TFT structure above the substrate comprises:

forming a gate electrode, and forming a scan line and the first capacitor electrode disposed at a layer the same as the gate electrode; sequentially forming a first insulating layer and an active layer above the gate electrode, the scan line and the first capacitor electrode being further covered by the first insulating layer, and the scan line and the first capacitor electrode being not covered by the active layer; forming a source electrode and a drain electrode above the active layer, and forming the second capacitor electrode, which is disposed at a layer the same as the source electrode and the drain electrode, above the first capacitor electrode; and forming a second insulating layer above the source electrode, the drain electrode and the second capacitor electrode, wherein the color resist layer, the first black matrix and the second black matrix are formed above the second insulating layer, and the pixel electrode is electrically coupled to one of the source electrode and the drain electrode through the first black matrix and the second insulating layer, and is further electrically coupled to the second capacitor electrode through the second black matrix and the second insulating layer.

Wherein, the method further comprises: forming an insulating protection layer between the pixel electrode and the first black matrix, the second black matrix and the color resist layer.

Wherein, the step of forming the first black matrix in the first opening area comprises: forming a first contact hole in the first black matrix and the second insulating layer at a location corresponding to one of the source electrode and the drain electrode, and forming a second contact hole in the second black matrix and the second insulating layer at a location corresponding to the second capacitor electrode; and the step of forming the insulating protection layer between the pixel electrode and the first black matrix, the second black matrix and the color resist layer comprises: forming the insulating protection layer in the first contact hole and the second contact hole; and forming a third contact hole and a fourth contact hole in the insulating protection layer in the first contact hole and the second contact hole, respectively, wherein the pixel electrode is electrically coupled to one of the source electrode and the drain electrode through the third contact hole, and is electrically coupled to the second capacitor electrode through the fourth contact hole.

In order to solve the technique problem above, the other technique solution adopted by the present invention is to provide a TFT substrate, wherein the TFT substrate comprises a substrate; a TFT structure being disposed above the substrate; a color resist layer being disposed above the substrate, wherein a first opening area in the color resist layer is formed at a location corresponding to the TFT structure; a first black matrix being disposed in the first opening area such that the TFT structure is covered by the first black matrix; and a pixel electrode being disposed above the color resist layer and the first black matrix, and being electrically coupled to the TFT structure through the first black matrix.

Wherein, the TFT substrate further comprises: a pixel electrode being disposed above the substrate, wherein a second opening area is formed in the color resist layer at a location corresponding to the electrode capacitor; and a second black matrix being disposed in the second opening area such that the electrode capacitor is covered by the second black matrix.

Wherein, the electrode capacitor comprises a first capacitor electrode and a second capacitor electrode, and the TFT substrate further comprises: a gate electrode being disposed above the substrate; a scan line and the first capacitor electrode being disposed in a layer the same as the gate electrode; a first insulating layer and an active layer being sequentially disposed above the gate electrode, wherein the scan line and the first capacitor electrode is further covered by the first insulating layer but not covered by the active layer; a source electrode and a drain electrode being disposed above the active layer; the second capacitor electrode being disposed above the first capacitor electrode and being at a layer the same as the source electrode and the drain electrode; and a second insulating layer being disposed above the source electrode, the drain electrode and the second capacitor electrode, wherein the color resist layer, the first black matrix and the second black matrix are formed above the second insulating layer, the pixel electrode is electrically coupled to one of the source electrode and the drain electrode through the first black matrix and the second insulating layer, and being further electrically coupled to the second capacitor electrode through the second black matrix and the second insulating layer.

Wherein, the TFT substrate further comprises: an insulating protection layer being disposed between the pixel electrode and the first black matrix, the second black matrix and the color resist layer.

Wherein, a first contact hole is formed in the first black matrix and the second insulating layer at a location corresponding to one of the source electrode and the drain electrode, and a second contact hole is formed in the second black matrix and the second insulating layer at a location corresponding to the second capacitor electrode; the insulating layer is formed in the first contact hole and the second contact hole; and a third contact hole and a fourth contact hole is formed in the insulating protection layer in the first contact hole and the second contact hole, respectively, wherein the pixel electrode is electrically coupled to one of the source electrode and the drain electrode through the third contact hole, and being electrically coupled to the second capacitor electrode through the fourth contact hole.

The efficacy of the present invention is that, distinguished from the prior art, the present invention disposes the black matrix at a side of the TFT substrate, such that the light could be shielded sufficiently, the light transmittance effect could be reduced and the contrast of the panel could be improved when the panel comprising the TFT substrate is bent.

DETAILED DESCRIPTION OF PREFERRED EMBODIMENTS

Figure 1:
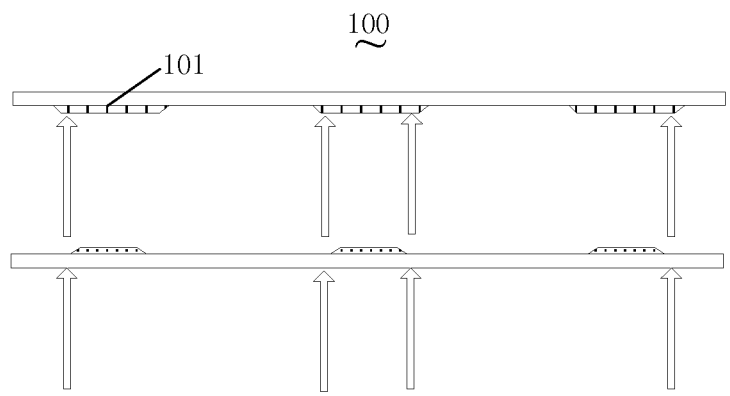
FIG. 1 is a light shielding effect diagram of a black matrix in a conventional panel when it is not bent.
Figure 2:
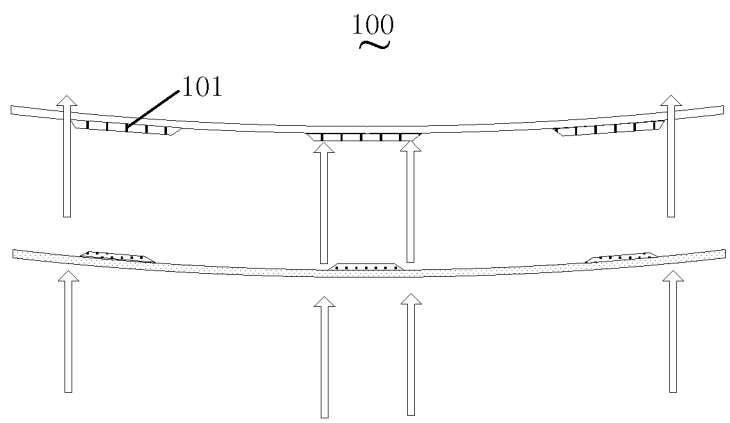
FIG. 2 is a light shielding effect diagram of a black matrix in a conventional panel when it is bent.
Figure 3:
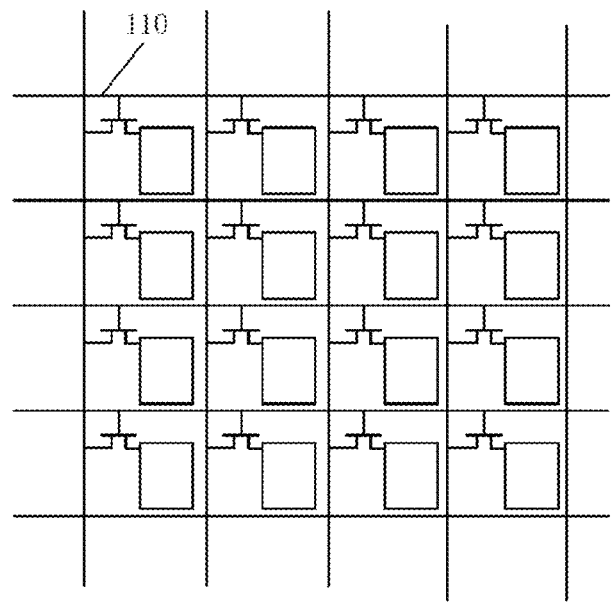
FIG. 3 is a schematic diagram of a TFT substrate provided by the embodiment of the present invention.

Please refer to FIG. 3, it is a schematic diagram of a TFT substrate provided by the embodiment of the present invention. As shown in FIG. 3, the TFT substrate in the embodiment of the present invention comprises a plurality of pixel units 100, wherein each pixel unit 110 has the same structure. The present invention will be described in detail by referring to the structure of one of the pixel units.

Figure 4:
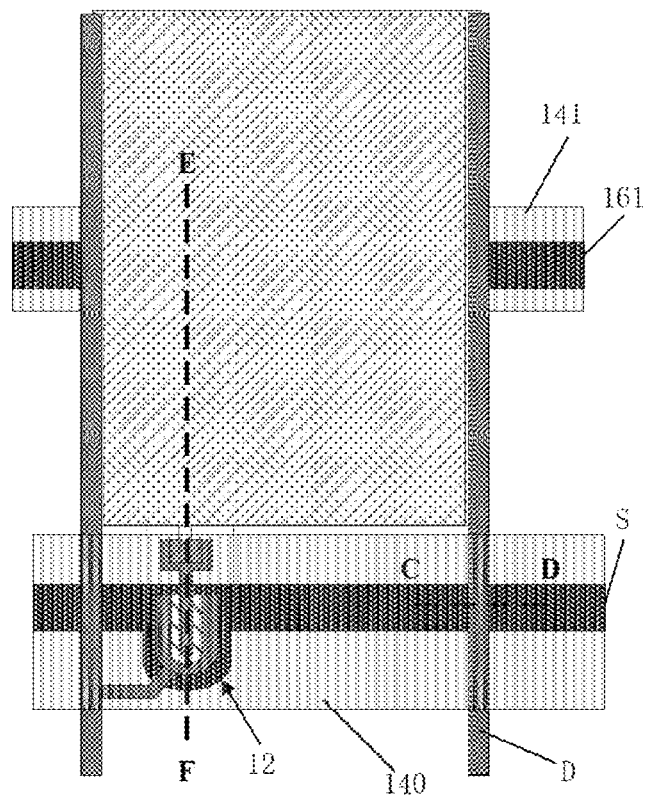
FIG. 4 is a schematic diagram of a pixel unit in the TFT substrate shown in FIG. 3.
Figure 5:
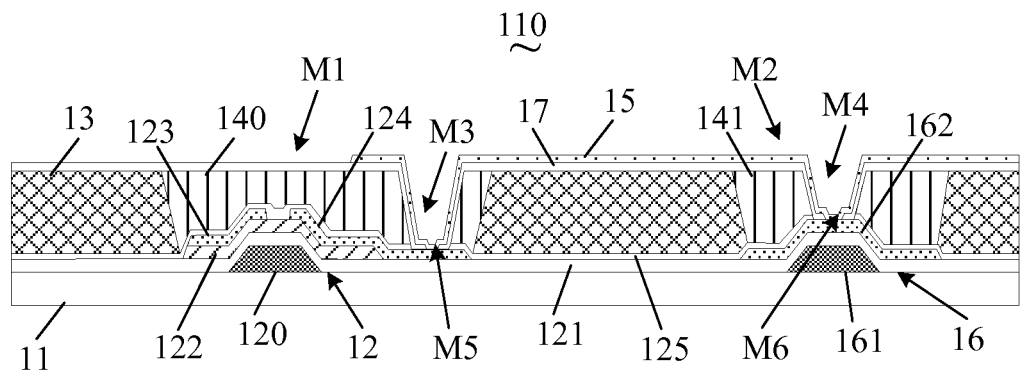
FIG. 5 is a cross-sectional diagram along the dotted line EF of the pixel unit shown in FIG. 4.

Please refer to FIG. 4~FIG. 5, FIG. 4 is a schematic diagram of one pixel unit 110 in the TFT substrate 10 shown in FIG. 3, and FIG. 5 is a cross-sectional diagram along the dotted line EF of the pixel unit 110 shown in FIG. 4. As shown in FIG. 4 and FIG. 5, the TFT substrate 10 in the embodiment of the present invention comprises a substrate 11, a TFT structure 12, a color resist layer 13, a black matrix 140 and a pixel electrode 15. Wherein, the TFT structure 12 is disposed above the substrate 11, and the color resist layer 13 is disposed above the substrate 11, wherein a first opening area M1 is formed in the color resist layer 13 at a location corresponding to the TFT structure 12. The black matrix 140 is disposed in the first opening area M1 such that the TFT structure 12 is covered by the black matrix 140. The pixel electrode 15 is disposed above the color resist layer 13 and the black matrix 140, and is electrically coupled to the TFT structure 12 through the black matrix 140.

Wherein, the color resist layer 13 comprises a red, a green and a blue (R, G and B) material, and the black matrix 140 is composed of black resin material.

Figure 6:
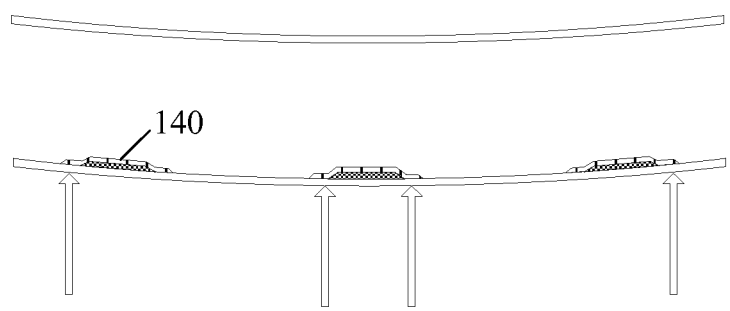
FIG. 6 is a light shielding effect diagram of a black matrix in a panel comprising the TFT substrate of the embodiment of the present invention when it is bent.

Therefore, in the embodiment, the black matrix 140 is disposed at a side of the TFT substrate 10 such that the capability of light shielding of the black matrix 140 disposed at the side of the TFT substrate 10 would not be affected and light transmittance would be reduced when the panel comprises the TFT substrate 10 is bent. The light shielding situation of the black matrix 140 in the embodiment of the present invention is illustrated as shown in FIG. 6. Therefore, the contrast of the panel comprising the TFT substrate 10 could be effectively improved.

In the embodiment, the TFT structure 12 comprises a gate electrode 120, a first insulating layer 121, an active layer 122, a source electrode 123, a drain electrode 124 and a second insulating layer 125.

Wherein, the gate electrode 120 is disposed above the substrate 11, the first insulating layer 121 and the active layer 122 are sequentially disposed above the gate electrode 120, the source electrode 123 and the drain electrode 124 are disposed above the active layer 122, with the source electrode 123 and the drain electrode 124 being disposed in the same layer, and the second insulating layer 125 is disposed above the source electrode 123 and the drain electrode 124. The black matrix 140 is disposed above the second insulating layer 125, that is, the second insulating layer 125 is disposed between the black matrix 140 and the source electrode 123 and the drain electrode 124 so that the source electrode 123 and the drain electrode 124 could be protected effectively.

Wherein, a material of the active layer 122 comprises hydrogenated amorphous silicon (a-Si:H), and the pixel electrode 15 is an ITO (Indium Tin Oxide) transparent electrode.

In the embodiment, the TFT substrate 10 further comprises an electrode capacitor 16 and a black matrix 141.

Wherein, the electrode capacitor 16 is disposed above the substrate 11, and a second opening area M2 is formed in the color resist layer 13 at a location corresponding to the electrode capacitor 16. The black matrix 141 is disposed in the second opening area M2 such that the electrode capacitor 16 is covered by the black matrix 141.

Wherein, the electrode capacitor 16 comprises a first capacitor electrode 161 and a second capacitor electrode 162. The first capacitor electrode 161 is disposed at a layer the same as the gate electrode 120. The first insulating layer 121 further covers above the first capacitor electrode 161, and the active layer 122 does not cover above the first capacitor electrode 161. The second capacitor electrode 162 is disposed above the first capacitor electrode 161, and is disposed at a layer the same as the source electrode 123 and the drain electrode 124. The second insulating layer 125 is further disposed above the second capacitor electrode 162. Because the first capacitor electrode 161 is covered by the first insulating layer 121, the second capacitor electrode 162 is disposed above the first insulating layer 121 to which the first capacitor electrode 161 corresponds.

Wherein, the TFT substrate 10 further comprises an insulating protection layer 17, which is disposed between the pixel electrode 15 and the black matrix 140, 141 and the color resist layer 13, so as to protect the liquid crystal in the panel comprising the TFT substrate 10 from being polluted.

In the embodiment, the color resist layer 13, the black matrix 140 and the black matrix 141 are formed above the second insulating layer 125. The pixel electrode 15 is electrically coupled to the drain electrode 124 through the black matrix 140 and the second insulating layer 125, and is further electrically coupled to the second capacitor electrode 161 through the black matrix 141 and the second insulating layer 125.

Specifically, a first contact hole M3 is formed in the black matrix 140 and the second insulating layer 125 at a location corresponding to the drain electrode 124, and a second contact hole M4 is formed in the black matrix 141 and the second insulating layer 125 at a location corresponding to the second capacitor electrode 161. Wherein, the insulating protecting layer 17 is formed in the first contact hole M3 and the second contact hole M4. A third contact hole M5 and a fourth contact hole M6 are formed in the insulating protection layer 17 in the first contact hole M3 and the second contact hole M4, respectively, wherein the pixel electrode 15 is electrically coupled to the drain electrode 124 through the third contact hole M5, and is electrically coupled to the second capacitor electrode 161 through the fourth contact hole M6.

In other embodiment, the pixel electrode 15 can be further electrically coupled to the source electrode 123 through the black matrix 140 and the second insulating layer 125. Specifically, the first contact hole M3 is disposed in the black matrix 140 and the second insulating layer 125 at a location corresponding to the source electrode 123, and, the same as above, the third contact hole M5 is formed in the insulating protection layer 17 in the first contact hole M3. The pixel electrode 15 is electrically coupled to the source electrode through the third contact hole M5.

Figure 7:
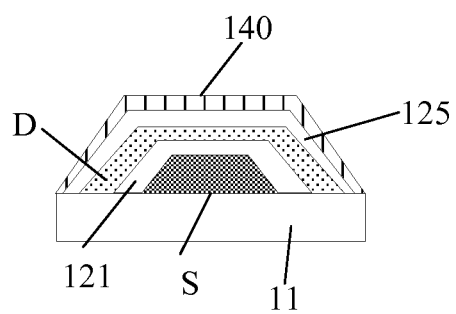
FIG. 7 is a cross-sectional diagram along the dotted line CD of the pixel unit shown in FIG. 4.

Please refer to FIG. 4 and FIG. 7, FIG. 7 is a cross-sectional diagram along the dotted line CD of the pixel unit 110 shown in FIG. 4. As shown in FIG. 4 and FIG. 7, the pixel unit 110 in the TFT substrate 10 further comprises a scan line S and a data line D. Wherein, the scan line S is disposed above the substrate 11 and is disposed at a layer the same as the gate electrode 120 and the first capacitor electrode 161. Wherein, the scan line S is further covered by the first insulating layer 121 but is not covered by the active layer 122. The data line D is disposed above the first insulating layer 121, and is disposed at a layer the same as the source electrode 123 and the drain electrode 124. Wherein, the second insulating layer 125 is further disposed above the data line D, and the black matrix 140 is disposed above the second insulating layer 125 at a location corresponding to the scan line S. That is, the scan line S is further covered by the black matrix 140.

Accordingly, the TFT substrate 10 of the present invention ensures that the light shielding capability of the black matrix 140 is not affected and the light transmittance is reduced, so that the contrast of the panel comprising the TFT substrate 10 can be improved effectively.

Figure 8:
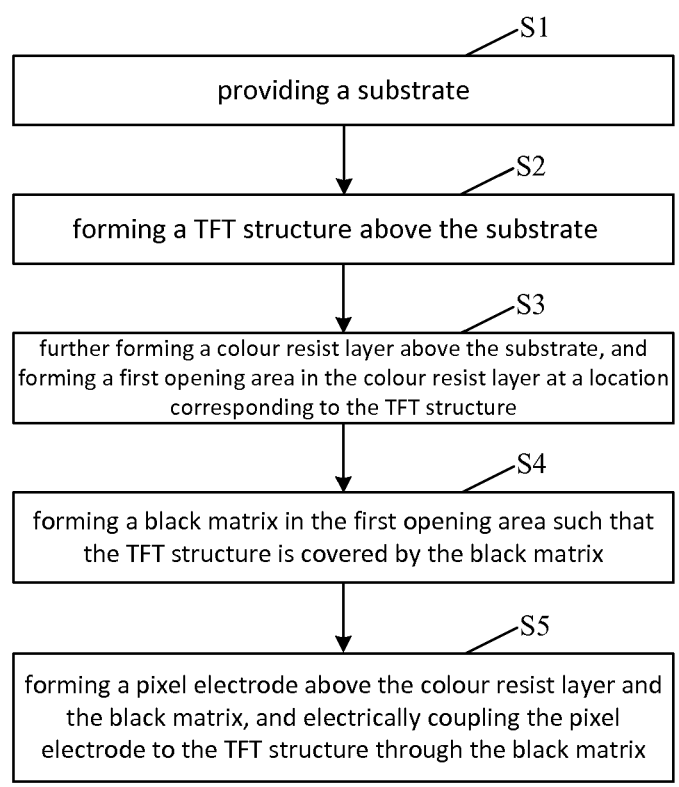
FIG. 8 is a flow chart of a method for manufacturing TFT substrate provided by the embodiment of the present invention.
Figure 9:
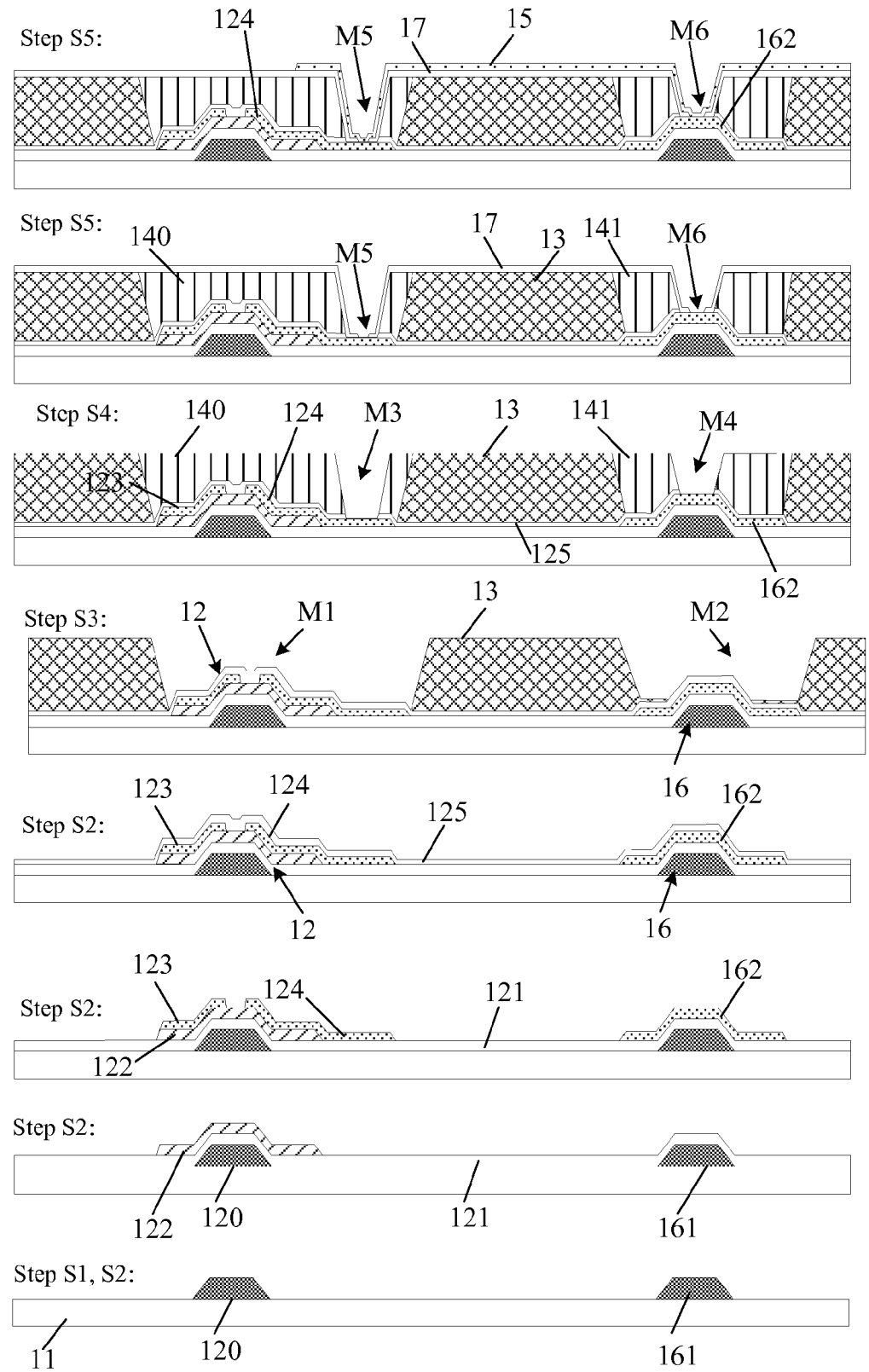
FIG. 9~FIG. 10 are process procedure diagrams of the method for manufacturing TFT substrate shown in FIG. 8.
Figure 10:
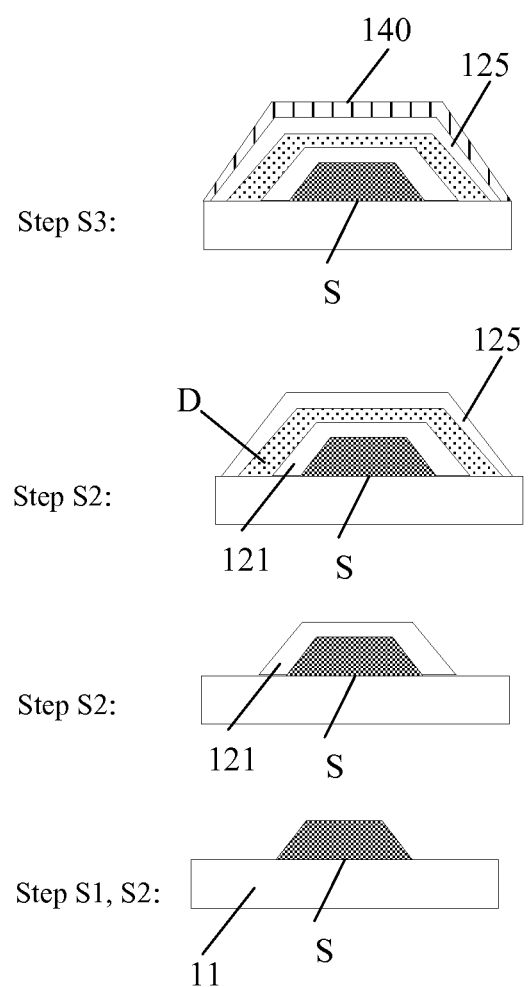

Based on the TFT substrate 10 described above, the present invention further provides a method for manufacturing TFT substrate which is shown in FIG. 8~FIG. 10.

Wherein, FIG. 8 is a flow chart of a method for manufacturing TFT substrate provided by the embodiment of the present invention; FIG. 9 is a process procedure diagram to which the method for manufacturing the TFT substrate shown in FIG. 8 corresponds; and FIG. 10 is another process procedure diagram to which the method for manufacturing TFT substrate shown in FIG. 8 corresponds. As shown in FIG. 8~FIG. 10, the method for manufacturing TFT substrate provided by the embodiment of the present invention comprises the following steps:

Step S1: providing the substrate 11.

Step S2: forming the TFT structure 12 above the substrate 11.

Specifically, this step is to form the gate electrode 120 above the substrate 11 in the first, and then, the first insulating layer 121 and the active layer 122 are sequentially formed above the gate electrode 120; furthermore, the source electrode 123 and the drain electrode 124 are formed above the active layer 122, and, finally, the second insulating layer 125 is formed above the drain electrode 124. The whole TFT structure are formed thereby.

In this step, the electrode capacitor 16 and signal lines are formed at the same time when the TFT structure 12 is formed, wherein the electrode capacitor 16 comprises the first capacitor electrode 161 and the second capacitor electrode, and the signal lines comprises the scan line S and the data line D.

Wherein, the specific process for forming the electrode capacitor 16 is as follows: forming the first capacitor electrode 161 above the substrate 11 at a layer the same as the gate electrode 120, and then, forming the first insulating layer 121 above the first capacitor electrode 161 such that the first capacitor electrode 161 is further covered by the first insulating layer 121. Furthermore, the second capacitor electrode 162 is formed above the first capacitor electrode 161 at a layer the same as the source electrode 123 and the drain electrode 124. Because the first capacitor electrode 161 is covered by the first insulating layer 121, the second capacitor electrode 162 is specifically formed above the first insulating layer 121 at a location corresponding to the first capacitor electrode 161. Finally, the second insulating layer 125 is formed above the second capacitor electrode 162. Thereby, manufacture of the electrode capacitor 16 is complete.

The specific process for forming the signal line is as follows: forming the scan line S above the substrate 11 at a layer the same as the gate electrode 120 in the first, and then, forming the first insulating layer 121 above the scan line S so as to further cover the scan line S by the first insulating layer 121. Wherein, the scan line S is not covered by the active layer 122. Furthermore, the data line D is formed above the first insulating layer 121. Finally, the second insulating layer 125 is formed above the data line D.

Step S3: further forming the color resist layer 13 above the substrate 11, and forming a first opening area M1 in the color resist layer 13 at a location corresponding to the TFT structure.

In this step, a second opening area M2 is further formed in the color resist layer 13 at a location corresponding to the electrode capacitor 16.

Step S4: forming the black matrix 140 in the first opening area M1 so as to cover the TFT structure 12 by the black matrix 140.

In this step, the black matrix 141 is further formed in the second opening area M2 so as to cover the electrode capacitor 16 by the black matrix 141.

Wherein, the color resist layer 13, the black matrix 140 and the black matrix 141 are formed in the same layer. The color resist layer 13 and the black matrices 140 and 141 are formed above the second insulating layer 125.

Step S5: forming the pixel electrode 15 above the color resist layer 13 and the black matrix 140, and electrically coupling the pixel electrode 15 and the TFT structure 12 through the black matrix 140. Specifically, the pixel electrode 15 is electrically coupled to the drain electrode 124 through the black matrix 140 and the second insulating layer 125. Moreover, the pixel electrode 15 is further electrically coupled to the second capacitor electrode 162 through the black matrix 141 and the second insulating layer 125.

Specifically, in the step S4, the first contact hole M3 is further formed in the black matrix 140 and the second insulating layer 125 at a location corresponding to the drain electrode 124, and the second contact hole M4 is formed in the black matrix 141 and the second insulating layer 125 at a location corresponding to the second capacitor electrode 162.

In this step, the insulating protection layer 17 is formed above the color resist layer 13 and the black matrices 140 and 141. Furthermore, the insulating protection layer 17 is formed in the first contact hole M3 and the second contact hole M4. The third contact hole M5 and the fourth contact hole M6 are formed in the insulating layer 17 in the first contact hole M3 and the second contact hole M4, respectively.

Furthermore, the pixel electrode 15 is formed above the insulating protection layer 17, that is, the insulating protection layer 17 is formed between the pixel electrode 15 and the black matrices 140 and 141 and the color resist layer 13. Wherein, the pixel electrode 15 is electrically coupled to the drain electrode 124 through the third contact hole M5, and is electrically coupled to the second capacitor electrode 162 through the fourth contact hole M6.

In other embodiments, the pixel electrode 15 could further be electrically coupled to the source electrode 123 through the black matrix 140 and the second insulating layer 125. Specifically, the first contact hole M3 could be formed in the black matrix 140 and the second insulating layer 125 at a location corresponding to the source electrode 123, and, the same as above, the third contact hole M5 could be formed in the insulating protection layer 17 in the first contact hole M3, and the pixel electrode 15 could be electrically coupled to the source electrode 123 through the third contact hole M5.

In summary, the TFT substrate 10 of the present invention ensures that the light shielding capability of the black matrix 140 is not affected and the light transmittance is reduced, so that the contrast of the panel comprising the TFT substrate 10 can be improved effectively.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method for manufacturing TFT substrate, wherein the method comprises the steps of:
   providing a substrate;
   forming a TFT structure above the substrate;
   further forming a color resist layer above the substrate, and forming a first opening area in the color resist layer at a location corresponding to the TFT structure;
   forming a first black matrix in the first opening area such that the TFT structure is covered by the first black matrix; and
   forming a pixel electrode above the color resist layer and the first black matrix, and the pixel electrode being electrically coupled to the TFT structure through the first black matrix;
   wherein the step of forming the TFT structure above the substrate further comprises:
     forming an electrode capacitor above the substrate, wherein a second opening area in the color resist layer is formed at a location corresponding to the capacitor capacitance, and the electrode capacitor comprises a first capacitor electrode and a second capacitor electrode;
   the step of forming the first black matrix in the first opening area further comprises:
     forming a second black matrix in the second opening area such that the electrode capacitor is covered by the second black matrix;
   the step of forming the TFT structure above the substrate further comprises:
     forming a gate electrode, and forming a scan line and the first capacitor electrode disposed at a layer the same as the gate electrode;
     sequentially forming a first insulating layer and an active layer above the gate electrode, the scan line and the first capacitor electrode being further covered by the first insulating layer, and the scan line and the first capacitor electrode being not covered by the active layer;
     forming a source electrode and a drain electrode above the active layer, and forming the second capacitor electrode, which is disposed at a layer the same as the source electrode and the drain electrode, above the first capacitor electrode; and
     forming a second insulating layer above the source electrode, the drain electrode and the second capacitor electrode, wherein the color resist layer, the first black matrix and the second black matrix are formed above the second insulating layer, and the pixel electrode is electrically coupled to one of the source electrode and the drain electrode through the first black matrix and the second insulating layer, and is further electrically coupled to the second capacitor electrode through the second black matrix and the second insulating layer;
   the method further comprises:
     forming an insulating protection layer between the pixel electrode and the first black matrix, the second black matrix and the color resist layer;
   the step of forming the first black matrix in the first opening area further comprises:
     forming a first contact hole in the first black matrix and the second insulating layer at a location corresponding to one of the source electrode and the drain electrode, and forming a second contact hole in the second black matrix and the second insulating layer at a location corresponding to the second capacitor electrode;
   the step of forming the insulating protection layer between the pixel electrode and the first black matrix, the second black matrix and the color resist layer further comprises:
     forming the insulating protection layer in the first contact hole and the second contact hole; and
     forming a third contact hole and a fourth contact hole in the insulating protection layer in the first contact hole and the second contact hole, respectively, wherein the pixel electrode is electrically coupled to one of the source electrode and the drain electrode through the third contact hole, and is electrically coupled to the second capacitor electrode through the fourth contact hole
   wherein the color resist layer comprises a red, a green and a blue material, and the black matrix is composed of black resin material.

2. A method for manufacturing TFT substrate, wherein the method comprises the steps of:
   providing a substrate;
   forming a TFT structure above the substrate;
   further forming a color resist layer above the substrate, and forming a first opening area in the color resist layer at a location corresponding to the TFT structure;
   forming a first black matrix in the first opening area such that the TFT structure is covered by the first black matrix; and
   forming a pixel electrode above the color resist layer and the first black matrix, and the pixel electrode being electrically coupled to the TFT structure through the first black matrix,
   wherein the step of forming the TFT structure above the substrate further comprises:
     forming an electrode capacitor above the substrate, wherein a second opening area in the color resist layer is formed at a location corresponding to the capacitor capacitance, and the electrode capacitor comprises a first capacitor electrode and a second capacitor electrode;
   the step of forming the first black matrix in the first opening area further comprises:
     forming a second black matrix in the second opening area such that the electrode capacitor is covered by the second black matrix;
   the step of forming the TFT structure above the substrate further comprises:
     forming a gate electrode, and forming a scan line and the first capacitor electrode disposed at a layer the same as the gate electrode;
     sequentially forming a first insulating layer and an active layer above the gate electrode, the scan line and the first capacitor electrode being further covered by the first insulating layer, and the scan line and the first capacitor electrode being not covered by the active layer;

forming a source electrode and a drain electrode above the active layer, and forming the second capacitor electrode, which is disposed at a layer the same as the source electrode and the drain electrode, above the first capacitor electrode; and forming a second insulating layer above the source electrode, the drain electrode and the second capacitor electrode, wherein the color resist layer, the first black matrix and the second black matrix are formed above the second insulating layer, and the pixel electrode is electrically coupled to one of the source electrode and the drain electrode through the first black matrix and the second insulating layer, and is further electrically coupled to the second capacitor electrode through the second black matrix and the second insulating layer;

the method further comprises:

forming an insulating protection layer between the pixel electrode and the first black matrix, the second black matrix and the color resist layer;

the step of forming the first black matrix in the first opening area further comprises:

forming a first contact hole in the first black matrix and the second insulating layer at a location corresponding to one of the source electrode and the drain electrode, and forming a second contact hole in the second black matrix and the second insulating layer at a location corresponding to the second capacitor electrode;

the step of forming the insulating protection layer between the pixel electrode and the first black matrix, the second black matrix and the color resist layer further comprises:

forming the insulating protection layer in the first contact hole and the second contact hole; and forming a third contact hole and a fourth contact hole in the insulating protection layer in the first contact hole and the second contact hole, respectively, wherein the pixel electrode is electrically coupled to one of the source electrode and the drain electrode through the third contact hole, and is electrically coupled to the second capacitor electrode through the fourth contact hole.

* * * * *